United States Patent [19]
Itoh

[11] Patent Number: 5,762,504
[45] Date of Patent: Jun. 9, 1998

[54] ELECTRIC CONNECTION UNIT

[75] Inventor: Atsushi Itoh, Yamagata, Japan

[73] Assignee: NEC Corporation, Japan

[21] Appl. No.: 781,963

[22] Filed: Dec. 20, 1996

[30] Foreign Application Priority Data

Dec. 21, 1995 [JP] Japan .................................. 7-333066

[51] Int. Cl.⁶ ...................................................... H01R 9/09
[52] U.S. Cl. .................................................. 439/66; 439/197
[58] Field of Search ................................ 439/197, 74, 66

[56] References Cited

U.S. PATENT DOCUMENTS 5,228,862  7/1993  Baumberger et al. .................... 439/197

FOREIGN PATENT DOCUMENTS 525726  4/1993  Japan .

Primary Examiner—Gary F. Paumen
Attorney, Agent, or Firm—Hayes, Soloway, Hennessey, Grossman & Hage, P.C.

[57] ABSTRACT

An electric connection unit includes a gas-tight housing to be put between a test board and a probe card located separately from each other. The housing has a plurality of pairs of contact pins each pair interconnected by a conductor wire and movably and gas-tightly inserted through holes formed in opposing walls of the housing, to be movable without being subjected to restriction of the conductor wire. A gas is introduced into the housing to push each pair of contact pins outwardly so that each pair of contact pins are brought into contact with corresponding conductive pads provided on test board and the probe card, with a constant contact pressure determined by a gas pressure. Even if there is variation in the projection length of the contact pins and in the distance to the conductive pads, all the contact pins can be brought into contact with corresponding conductive pads with a uniform contact pressure, with the result that an excellent and reliable electric connection can be obtained.

6 Claims, 4 Drawing Sheets

ELECTRIC CONNECTION UNIT

BACKGROUND OF THE INVENTION

1. Field of the Invention

The present invention relates to an electric connection unit for electrically interconnecting between a plurality of conductive pads of two boards located separately from each other.

2. Description of Related Art

In the prior art, most of this type electric connection units have such a construction that only one of opposite surfaces of the unit has a plurality of movable contact pins which can contact with conductive pads and can be separated from the conductive pads, and the other surface of the unit has a plurality of fixed pins, excluding for only a few exceptions having such a construction that movable contact pins are provided on each of opposite surfaces of the unit.

Referring to FIG. 1, there is shown a diagrammatic perspective view for illustrating one example of the prior art electric connection unit. The electric connection unit shown in FIG. 1 is a probe ring 32 used in a measurement equipment for measuring an electronic component. The shown probe ring 32 includes a plurality of movable contact pins 27 for contacting with conductive pads of the electronic component, and a corresponding number of fixed pins 33 which are connected through conductors 30 to the movable contact pins 27, respectively, and which are inserted into conductive holes 31 provided in a probe card 28, respectively. Each of movable contact pins 27 is biased by a spring 29 accommodated in a sleeve 29A, to project from an upper surface of the probe ring 32.

In case of measuring the electronic component, the probe ring 32 mounted on the probe card 28 is lowered (but in an upward direction in FIG. 1) so that the movable contact pins 27 are brought into contact with conductive pads of the electronic component. At this time, the contact pins are electrically connected with the conductive pads with a contact pressure given by a restituting or restoring force (reaction) of the spring 29.

In the above mentioned prior electric connection unit, since the contact force between the contact pin and the conductive pad is given by the restituting or restoring force of the spring, a variation occurs in the distance by which the contact pin is pushed back into the probe ring as the result of the contact of the contact pin with the conductive pad, with the result that a variation also occurs in the contact pressure. This variation of the contact pressure results in a poor contact of a contact pin or pins with a corresponding conductive pad or pads.

In order to equalize the contact pressure, for example, Japanese Utility Model Application Laid-open Publication No. Heisei 5-25726 proposes a board fixing device featured in that a tube is provided on a rear surface of a probe card brought into contact with fixed contact pins.

However, this proposal can resolve the poor contact attributable to an inadequate mounting of the probe card, but cannot absorb the variation in projection height of individual contact pints In order to obtain a predetermined contact pressure, it may be considered to increase the distance by which the contact pin is pushed back into the probe ring as the result of the contact of the contact pin with the conductive pad. In this approach, however, an excessive pushing force occurs in the contact pin, with the result that the contact pin may be bent or broken.

Furthermore, since each contact pin is constituted of several parts including the spring and the sleeve and since electric connection between the several parts is realized by mutual contact between the several parts, contact surface is easy to be oxidized, or dirt is apt to deposit on the contact surface, with the result that a poor contact occurs in the inside of the contact pin. On the other hand, since the spring for exerting the contact pressure has a lifetime, the sprig itself must be exchanged periodically or if necessary. This rises up a running cost of the electric connection unit.

SUMMARY OF THE INVENTION

Accordingly, it is an object of the present invention to provide an electric connection unit which has overcome the above mentioned defect of the conventional one.

Another object of the present invention is to provide an electric connection unit capable of realizing an electric connection having a uniform contact pressure even if variation exists in a distance between conductive pads of a board and contact pins, and having a long lifetime of the contact pins.

The above and other objects of the present invention are achieved in accordance with the present invention by an electric connection unit for electrically connecting between a plurality of conductive pads of a first board and a plurality of conductive pads of a second board which is located separately from the first board to face the first board, comprising at least one pair of contact pins movable in opposite directions on a straight line connecting between one conductive pad of the first board and a corresponding conductive pad of the second board, so that the at least one pair of contact pins can be contacted with or separated from the one conductive pad of the first board and the corresponding conductive pad of the second board, respectively, a conductor wire for electrically interconnecting between the at least one pair of contact pins without restraining the movement of the at least one pair of contact pins, and a fluid pressure applying means for applying a fluid pressure to the at least one pair of contact pins to force the at least one pair of contact pins into contact with the one conductive pad of the first board and the corresponding conductive pad of the second board, respectively, with a predetermined constant contact pressure.

In a preferred embodiment, the fluid pressure applying means is composed of a pneumatic means having a gas-tight housing, the at least one pair of contact pins being gas-tightly slidably inserted in holes formed through opposite walls of the gas-tight housing, respectively, and the gas-tight housing having a gas port, so that when a gas is introduced into the gas-tight housing, a gas pressure acts on each of the at least one pair of contact pins, thereby to push out the at least one pair of contact pins from the gas-tight housing whereby the at least one pair of contact pins are brought into contact with the one conductive pad of the first board and the corresponding conductive pad of the second board, respectively, with the predetermined constant contact pressure determined by the gas pressure, and when the gas is discharged from the gas-tight housing, a negative pressure retracts the at least one pair of contact pins from the gas-tight housing whereby the at least one pair of contact pins are separated from the one conductive pad of the first board and the corresponding conductive pad of the second board, respectively.

In another preferred embodiment, the fluid pressure applying means is an expandable bag-like member sandwiched between respective base ends of the at least one pair of contact pins, the expandable bag-like member having a fluid introducing and discharging port, so that when a fluid is introduced into the expandable bag-like member, the expandable bag-like member is expanded to push out the at least one pair of contact pins in a direction that the at least one pair of contact pins become remote from each other, whereby the at least one pair of contact pins are brought into contact with the one conductive pad of the first board and the corresponding conductive pad of the second board, respectively, with the predetermined constant contact pressure determined by the fluid pressure, and when the fluid is discharged from the expandable bag-like member, the expandable bag-like member contracts to retract the at least one pair of contact pins, whereby the at least one pair of contact pins are separated from the one conductive pad of the first board and the corresponding conductive pad of the second board, respectively. For example, the expandable bag-like member is formed of a rubber tube.

The above and other objects, features and advantages of the present invention will be apparent from the following description of preferred embodiments of the invention with reference to the accompanying drawings.

DESCRIPTION OF THE PREFERRED EMBODIMENTS

Figure 1:
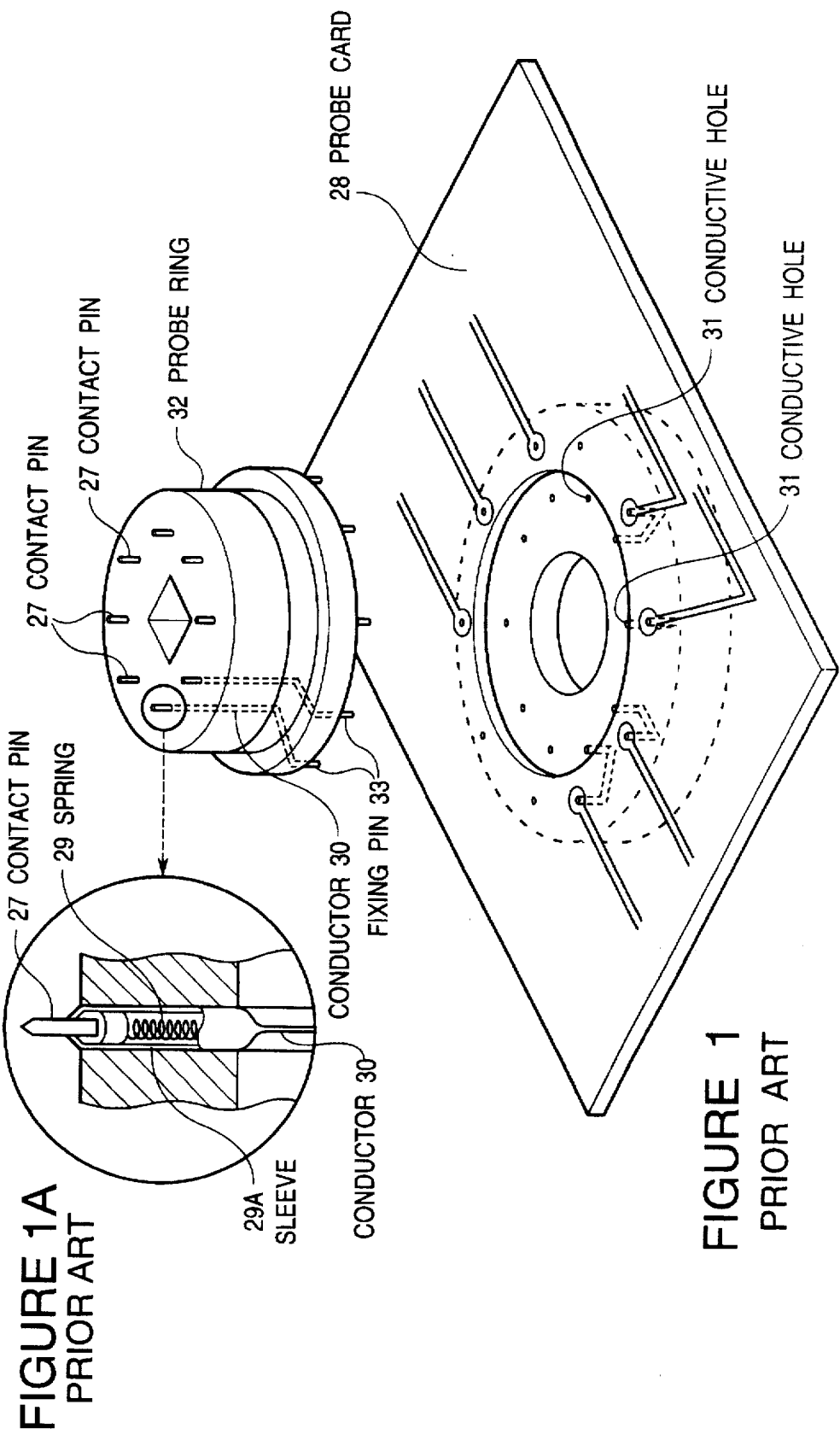
FIG. 1 is a diagrammatic perspective view for illustrating one example of the, art electric connection unit.
Figure 2:
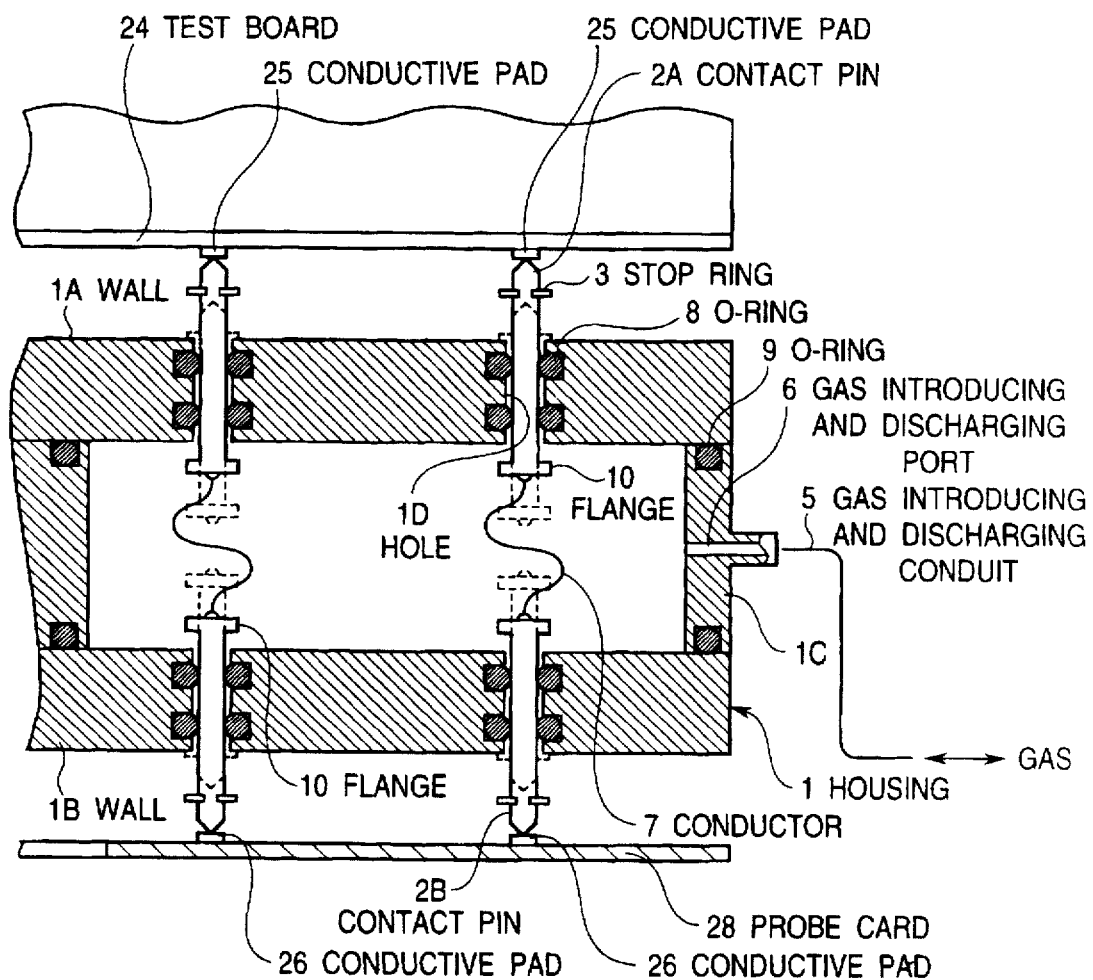
FIG. 2 is an enlarged diagrammatic, partial sectional view of a first embodiment of electric connection unit in accordance with the present invention.

Referring to FIG. 2, there is shown an enlarged diagrammatic, partial sectional view of a first embodiment of the electric connection unit in accordance with the present invention.

As shown in FIG. 2, the shown first embodiment of the electric connection unit comprises a gas-tight housing 1 to be located between a test board 24 and a probe card 28, but separately from each of the test board 24 and the probe card 28. The gas-tight housing 1 includes a pair of first and second walls 1A and 1B opposing to each other, separately from each other, and a circular or rectangular cylindrical side wall 1A gas-tightly sandwiched between the first and second opposing walls 1A and 1B with an O-ring being gas-tightly interposed between each of the opposing walls 1A and 1B and a corresponding end face of the cylindrical side wall 1C. Accordingly, the opposing walls 1A and 1B are separated from each other by the side wall 1C, and an internal space is gas-tightly confirmed by the opposing walls 1A and 1B and the side wall 1C.

The shown first embodiment also includes a plurality of pairs of movable contact pins 2A and 2B. Each pair of contact pins 2A and 2B are aligned in a straight line to extend in a direction opposite to each other. One of each pair of contact pins 2A gas-tightly passes through a hole 1D formed in the first opposing wall 1A, in such a manner that a tip end projects outwardly from the housing 1 to contact with a corresponding one of a plurality of conductive pads 25 formed on the test board 24, and a base end is located within the housing 1. The other of each pair of contact pins 2B gas-tightly passes through a hole 1D formed in the second opposing wall 1B, similarly, in such a manner that a tip end projects outwardly from the housing 1 to contact with a corresponding one of a plurality of conductive pads 26 formed on the probe card 28, and a base end is located within the housing 1. A plurality of O-rings 8 is inserted between an inner wall of the hole 1D and the contact pin inserted therethrough to gas-tightly seal between the hole 1D and the contact pin inserted therethrough but to allow the contact pin to be gas-tightly moved or slid in the hole 1D in an axial direction of the contact pin.

Furthermore, the side wall 1C includes a gas introducing and discharging port 5 to be coupled to a gas introducing and discharging conduit 5 for the purpose of introducing a gas into the housing 1 and discharging the gas from the housing 1.

Each of the contact pins 2A and 2B has a flange 10 formed at the base end thereof for preventing the contact pin from slipping off outside the housing. In addition, each of the contact pins 2A and 2B has a stop ring 3 fixed at a tip end side portion thereof which is projected from the housing 1, for preventing the contact pin from slipping off into the internal space of the housing. Incidentally, the size of the flange 10 is preferably determined by taking into consideration a pressure of a supplied gas and a desired or required contact pressure between the contact pins 2A and 2B and the conductive pads 25 and 26.

Moreover, each pair of contact pins 2A and 2B are electrically connected to each other by a conductor wire 7 having opposite ends which are connected to the base end of the contact pins 2A and 2B, respectively. Preferably, this conductor wire 7 is formed of a spiral wire having a length necessary and sufficient to allow each contact pin to be moved outwardly with a small force, to prevent a breaking or entanglement of the conductor wire caused by a twist attributable to the repeated movement of the contact pins, and to prevent the force of the twist from locally acting on the conductor wire.

As mentioned above, the O-ring 9 is interposed between the side wall 1C and each of the opposing walls 1A and 1B, for gas-tightly couple between the opposing walls 1A and 1B and the side wall 1C. Therefore, the housing 1 can be disassembled separately into the opposing walls 1A and 1B and the side wall 1C, for the purpose of an easy maintenance operation.

The gas introduced into the housing 1 may be air, but is preferred to be a nitrogen gas which is a cheap inert gas capable of preventing corrosion of an internal wall surface of the housing and the conductor wire 7.

Now, operation of the first embodiment of the electric connection unit mentioned above will be described.

In order to interconnect between the conductive pads 25 and 26 of the test board 24 and the probe card 28, first, the housing 1 is inserted between the test board 24 and the probe card 28, in such a condition that the internal space of the housing 1 is at the same pressure as the atmospheric pressure and the contact pins 2A and 2B are extracted into the housing 1 as shown by a ghost line in FIG. 2. Then, a reference surface of the housing 1 and a reference surface of each of the test board 24 and the probe card 28 are positioned in place, and furthermore, a relative position between the test board 24 and the probe card 28 is adjusted to cause each of the conductive pads 25 to be aligned with a corresponding one of the conductive pads 25, and then, the housing 1 is adjusted to cause each pair of contact pins 2A and 2B to be aligned on an imaginary line interconnecting between a corresponding conductive pad 25 and a corresponding conductive pad 26. In this condition, the housing 1 is fixed. Thus, a preparing operation is completed.

Thereafter, a pressurized gas is introduced through the gas port 6 into the internal space of the gas-tight housing 1, so as to elevate the gas pressure of the internal space of the gas-tight housing 1, with the result that the contact pins are forced to move outwardly so that each contact pill 2A and each contact pin 2B are brought into contact with the corresponding conductive pad 25 and the corresponding conductive pad 26, respectively, by action of the gas pressure. Accordingly, a certain electrical connection is realized between the conductive pads 25 and 26 through the shown electric connection unit.

After measurement is completed, the gas in the housing 1 is discharged so that the internal pressure of the housing 1 is lowered to a degree necessary for causing the contact pints 2A and 2B to be retracted into the housing.

By repeating the above mentioned operation, an electrical connection can be obtained between the conductive pads 25 and 26

As will be apparent from the above description, even if there is variation in a distance between each of the conductive pads 25 and 26 and a corresponding contact pin in a retracted position, since the amount of projection of each contact pin varies dependently upon the actual distance, the variation of the distance can be absorbed, and on the other hand, a reliable contact can be always realized with a constant contact pressure which is determined by the size of the flange 10 and the pressure of the supplied gas.

Figure 3A:
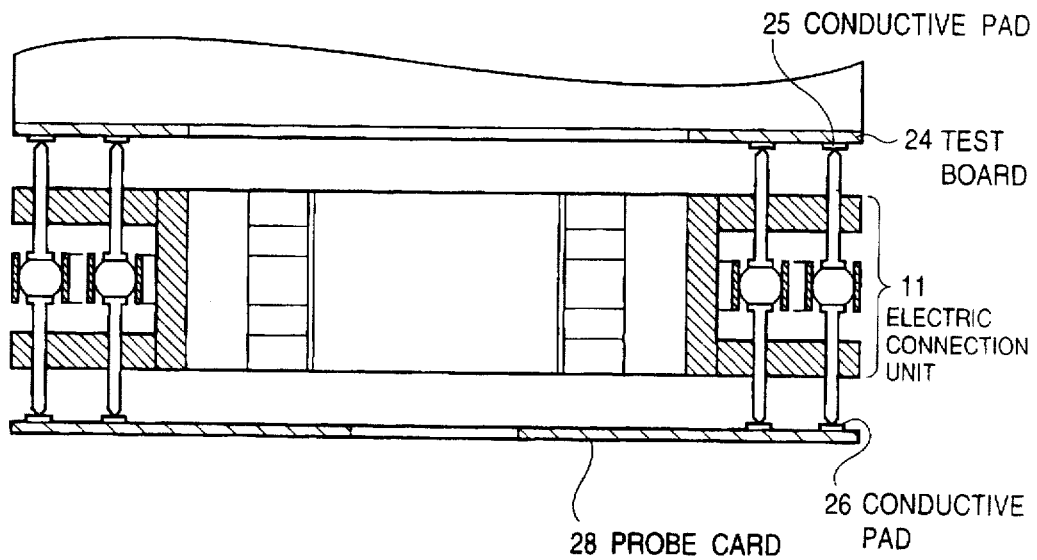
FIG. 3A is a diagrammatic sectional view of a second embodiment of the electric connection unit in accordance with the present invention.
Figure 3B:
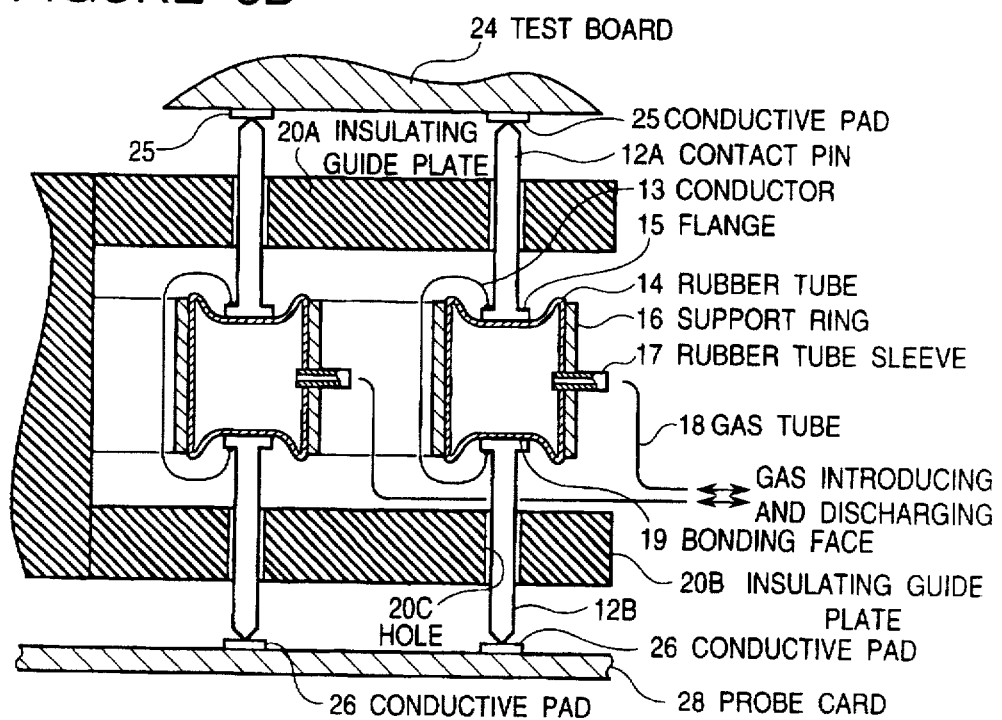
FIG. 3B is an enlarged diagrammatic, partial sectional view of the electric connection unit shown in FIG. 3A.

Now, a second embodiment of the electric connection unit in accordance with the present invention will be described with reference to FIGS. 3A and 3B. FIG. 3A is a diagrammatic sectional view of a second embodiment of the electric connection unit in accordance with the present invention, and FIG. 3B is an enlarged diagrammatic, partial sectional view of the electric connection unit shown in FIG. 3A. In FIGS. 3A and 3B, elements similar to those shown in FIG. 2 are given the same Reference Numerals, and explanation thereof will be omitted.

The second embodiment of the electric connection unit, generally designated by Reference Numeral 11, is configured to be inserted between the text board 24 and the probe card 28, and includes a pair of first and second insulating guide plates 20A and 20B, each of which has a plurality of through holes 20C each aligned on an imaginary line interconnecting between a corresponding conductive pad 25 and a corresponding conductive pad 26. The second embodiment also includes a plurality of pairs of movable contact pins 12A and 12B which are inserted through the through holes 20C of the first and second insulating guide plates 20A and 20B, respectively, and which are therefore aligned to the corresponding conductive pad 25 and the corresponding conductive pad 26. Each of the contact pins 12A and 12B has a flange 15 formed on a base end thereof located in a space defined between the pair of insulating guide plates 20A and 20B, and a tip end projecting outwardly from the corresponding insulating guide plate.

In the shown electric connection unit 11, a gas-tight flexible bag-like member such as an annular rubber tube 14 is located between the respective flange 15 of each pair of contact pins 12A and 12B, and is bonded at a bonding face 19 to the flange 15. The annular rubber tube 14 has a sleeve 17 to be gas-tightly coupled to a gas tube 18 for the purpose of introducing a pressurized gas through the gas tube 18 into the rubber tube 14 and discharging the gas through the gas tube 18 from the rubber tube 14. Furthermore, each rubber tube 14 is accommodated between a pair of support rings 16 for restricting a lateral expansion of the rubber tube 14.

Accordingly, if a pressurized gas is introduced through the gas tube 18 into the rubber tube 14, since the lateral expansion of the rubber tube 14 is restricted by the pair of support rings 16, the expanded rubber tube 14 pushes the pair of contact pins 12A and 12B outwardly in mutually opposite directions (vertical in the drawing), so that the tip end of the contact pins 12A and 12B are pushed outwardly from the insulative guide plates 20A and 20B, respectively. As a result, the tip end of tile contact pins 12A and 12B are brought into contact with the conductive pads 25 and 26, respectively. At this time, a contact pressure of the contact pins 12A and 12B to the conductive pads 25 and 26 is determined by the pressure of the supplied pressurized gas, and therefore, can be controlled in a wide range by controlling the pressure of the supplied pressurized gas.

Furthermore, each pair of contact pins 12A and 12B are electrically connected to each other by a conductor wire 13, which are electrically connected at its opposite ends to the respective flanges 15 of the pair of contact pins 12A and 12B, respectively. This conductor wire 13 have a length sufficient not to interfere with the expansion of the rubber tube 13. Preferably, a portion of the conductor wire 13 extending along the outside of the support ring 16 is insulatively fixed to the support ring 16, in order to prevent the conductor wire 13 from contacting with an adjacent contact pin or from being entangled with the gas tube 18.

Figure 4A:
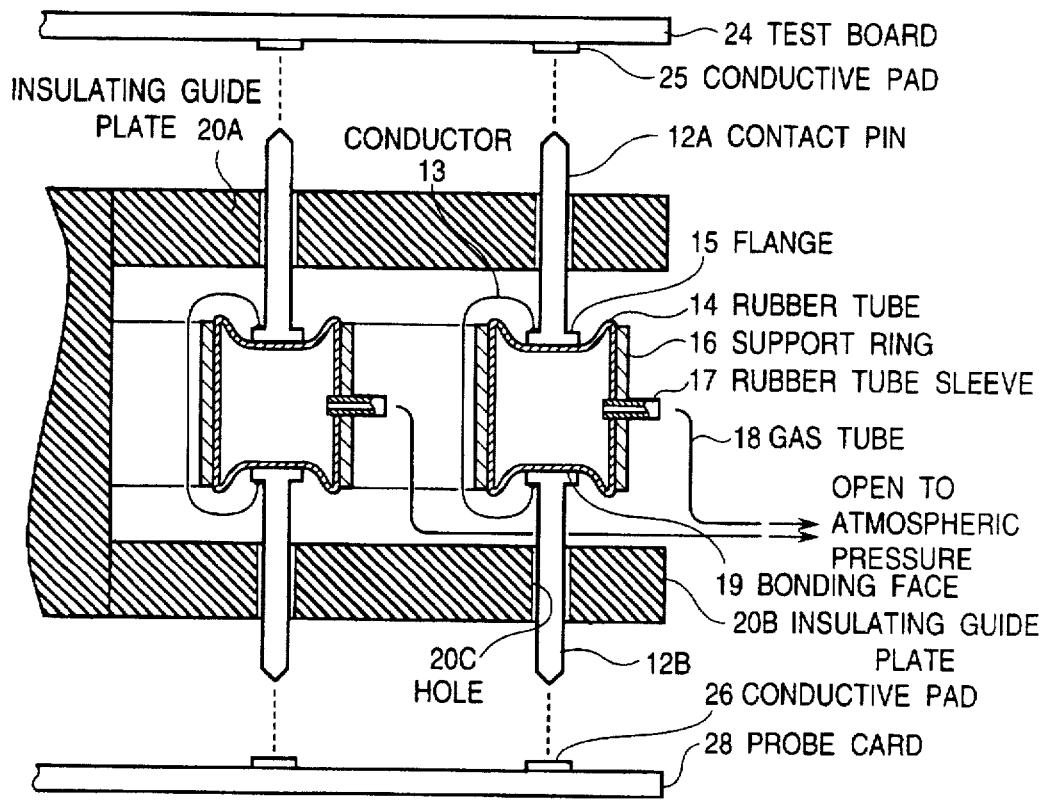
FIGS. 4A and 4B diagrammatic sectional views of the second embodiment for illustrating an operation of the electric connection unit.
Figure 4B:
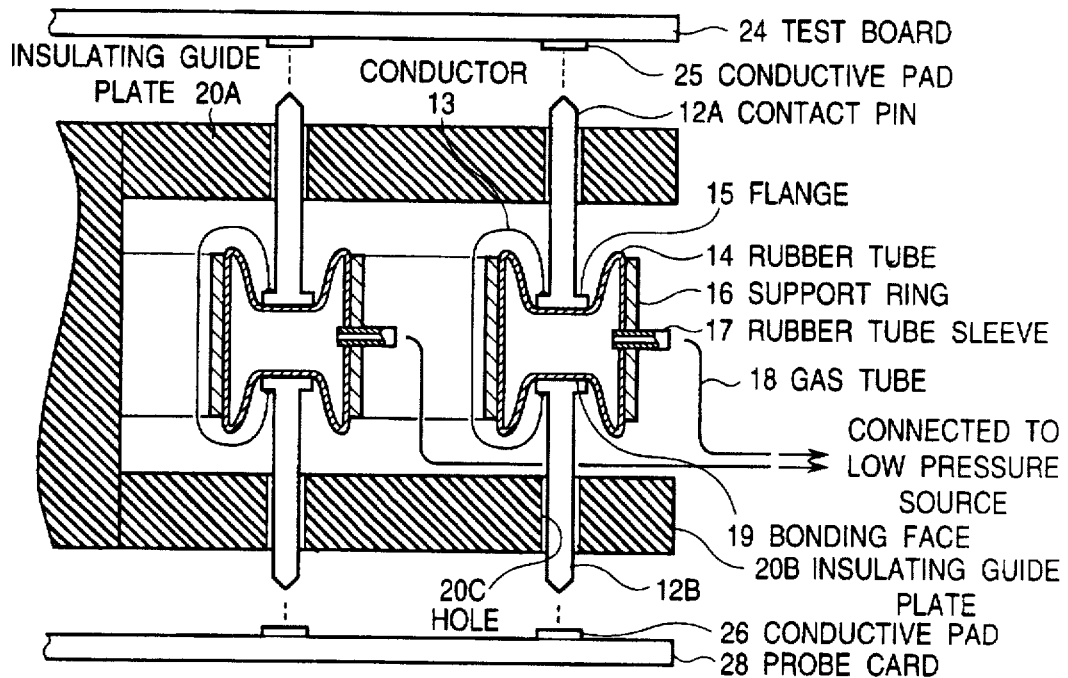

Now, operation of the second embodiment will be described with reference to FIG. 3B and FIGS. 4A and 4B. FIGS. 4A and 4B are diagrammatic sectional views of the second embodiment for illustrating an operation of the electric connection unit.

First, the internal gas pressure of the rubber tube 14 is brought to the same pressure as atmospheric pressure (initial condition). Then, the electric connection unit 11 is inserted between the test board 24 and the probe card 28, and a positioning and aligning operation is conducted to cause the conductive pads 25 and 26 and the contact pins 12A and 12B to be aligned on a straight line.

Thereafter, as shown in FIG. 3B, the pressurized gas is introduced through the gas tube 18 into the rubber tube 14, to expand the rubber tube 14 (pressurized condition). As a result, the contact pins 12A and 12B are pushed outwardly, so that the contact pins 12A and 12B are brought into the conductive pads 25 and 26 of the test board 24 and the probe card 28, respectively, with a constant contact pressure. Thus, a certain electrical connection is obtained between the conductive pads 25 and 26 of the test board 24 and the probe card 28.

In this connection, a test for one electronic component is conducted. After the test is completed, the pressurized gas in the rubber tube 14 is discharged through the gas tube 18 to the outside, and furthermore, the rubber tube 14 is evacuated to a low pressure lower than the atmospheric pressure (low pressure condition), so that the rubber tube 14 contracts remarkably, with the result that the contact pins 12A and 12B are retracted greatly as shown in FIG. 4B.

If the test for all electronic components is completed, the rubber tube 14 is returned to the atmospheric pressure, as shown in FIG. 4A, and the electric connection unit is removed. Here, as seen from comparison between FIGS. 4A and 4B, the amount of retraction of the contact pins 12A and 12B when the rubber tube 14 is evacuated to a low pressure lower than the atmospheric pressure, is larger than the amount of retraction of the contact pins 12A and 12B when the internal pressure of the rubber tube 14 is the same as the atmospheric pressure.

The second embodiment is more advantageous than the first embodiment, since the contact pins can be pushed outwardly independently of one another, and therefore, since a certain contact can be obtained even if the distance between each contact pin and a corresponding conductive pad varies from one conductive pad to another in the same couple of test board and probe card.

In the second embodiment, the air-tight bag-like member is constituted of an expandable rubber tube, but can be constituted of another means such as a bellows. In addition, the gas is introduced into and discharged from the air-tight bag-like member, but it would be apparent to person skilled in the art that a liquid can be introduced into and discharged from the air-tight bag-like member. Namely, a fluid can be introduced into and discharged from the air-tight bag-like member, for the purpose of expanding and contracting the air-tight bag-like member.

As seen from the above, the electric connection unit is characterized in that a pair of contact pins adapted to be brought into contact with conductive pads provided on a pair of boards located separately from each other for the purpose of realizing an electric connection between the conductive pads of the pair of boards, are movably provided without being subjected to restriction of a conductive member interconnecting the pair of contact pins, and furthermore, a fluid pressure applying means is provided to move the pair of contact pins to bring them into contact with the corresponding conductive pads with a constant contact pressure.

Therefore, even if there is variation in the projection length of the contact pins and in the distance to the conductive pads, all the contact pins can be brought into contact with corresponding conductive pads with a uniform contact pressure, with the result that an excellent and reliable electric connection can be obtained.

Furthermore, the fluid pressure applying means has a very simple construction, and on the other hand, does not require a spring or a sleeve (guiding the contact pin) which are easy to gets fatigued and broken. Therefore, it is possible to prevent the bent or break of the contact pins attributable to these causes. In addition, since the constant contact pressure can be always applied to the contact pins, namely, since no excessive contact pressure is applied to the contact pins, the lifetime of the contact pins can be made long, and therefore, a running cost can be reduced.

The invention has thus been shown and described with reference to the specific embodiments. However, it should be noted that the present invention is in no way limited to the details of the illustrated structures but changes and modifications may be made within the scope of the appended claims.

I claim:

1. A unit for electrically connecting between a plurality of conductive pads of a first board and a plurality of conductive pads of a second board which is located separately from the first board to face the first board, comprising at least one pair of contact pins movable in opposite directions on a straight line connecting between one conductive pad of said first board and a corresponding conductive pad of said second board, so that said at least one pair of contact pins can be contacted with or separated from said one conductive pad of said first board and said corresponding conductive pad of said second board, respectively, a conductor wire for electrically interconnecting between said at least one pair of contact pins without restraining the movement of said at least one pair of contact pins, and a fluid pressure applying means for applying a fluid pressure to said at least one pair of contact pins to force said at least one pair of contact pins into contact with said said one conductive pad of said first board and said corresponding conductive pad of said second board, respectively, with a predetermined constant contact pressure.

2. An electric connection unit claimed in claim 1 wherein said fluid pressure applying means is composed of a pneumatic means having a gas-tight housing, said at least one pair of contact pins being gas-tightly slidably inserted in holes formed through opposite walls of said gas-tight housing, respectively, and said gas-tight housing having a gas port, so that when a gas is introduced into said gas-tight housing, a gas pressure acts on each of said at least one pair of contact pins, thereby to push out said at least one pair of contact pins from said gas-tight housing whereby said at least one pair of contact pins are brought into contact with said said one conductive pad of said first board and said corresponding conductive pad of said second board, respectively, with said predetermined constant contact pressure determined by said gas pressure, and when said gas is discharged from said gas-tight housing, a negative pressure retracts said at least one pair of contact pins from said gas-tight housing whereby said at least one pair of contact pins are separated from said said one conductive pad of said first board and said corresponding conductive pad of said second board, respectively.

3. An electric connection unit claimed in claim 2 wherein each of said at least one pair of contact pins has a flange formed at a base end thereof which is positioned within said housing, for preventing the contact pin from slipping off outside said housing, and a stop ring fixed at a tip end side portion thereof which is projected from said housing, for preventing the contact pin from slipping off into an internal space of said housing.

4. An electric connection unit claimed in claim 1 wherein said fluid pressure applying means is an expandable bag-like member sandwiched between respective base ends of said at least one pair of contact pins, said expandable bag-like member having a fluid introducing and discharging port, so that when a fluid is introduced into said expandable bag-like member, said expandable bag-like member is expanded to push out said at least one pair of contact pins in a direction that said at least one pair of contact pins become remote from each other, whereby said at least one pair of contact pins are brought into contact with said said one conductive pad of said first board and said corresponding conductive pad of said second board, respectively, with said predetermined constant contact pressure determined by said fluid pressure, and when said fluid is discharged from said expandable bag-like member, said expandable bag-like member contracts to retract said at least one pair of contact pins, whereby said at least one pair of contact pins are separated from said said one conductive pad of said first board and said corresponding conductive pad of said second board, respectively.

5. An electric connection unit claimed in claim 4 wherein said expandable bag-like member is formed of a rubber tube.

6. An electric connection unit claimed in claim 5 wherein said rubber tube is accommodated between a pair of support rings for restricting a lateral expansion of said rubber tube.

* * * * *